United States Patent
Hsu et al.

(10) Patent No.: US 8,656,089 B2
(45) Date of Patent: Feb. 18, 2014

(54) ELECTRONIC DEVICE, MEMORY CONTROLLING METHOD THEREOF AND ASSOCIATED COMPUTER-READABLE STORAGE MEDIUM

(75) Inventors: Chia-Ming Hsu, New Taipei (TW); Wen-Hao Sung, Taipei (TW)

(73) Assignee: Mstar Semiconductor, Inc., Hsinchu (TW)

( * ) Notice: Subject to any disclaimer, the term of this patent is extended or adjusted under 35 U.S.C. 154(b) by 209 days.

(21) Appl. No.: 13/167,797

(22) Filed: Jun. 24, 2011

(65) Prior Publication Data

US 2012/0185639 A1 Jul. 19, 2012

(30) Foreign Application Priority Data

Jan. 14, 2011 (TW) .............................. 100101524 A

(51) Int. Cl.
*G06F 12/00* (2006.01)
(52) U.S. Cl.
USPC .................. 711/103; 711/E12.008; 707/697; 707/700; 714/6.24; 714/48; 714/52; 714/799; 714/E11.002
(58) Field of Classification Search
None
See application file for complete search history.

(56) References Cited

U.S. PATENT DOCUMENTS

| | | | | |
|---|---|---|---|---|
| 5,267,218 A * | 11/1993 | Elbert | ...................... | 365/185.04 |
| 5,428,579 A * | 6/1995 | Robinson et al. | ........ | 365/230.03 |
| 5,524,231 A * | 6/1996 | Brown | .......................... | 711/101 |
| 5,845,332 A * | 12/1998 | Inoue et al. | ................... | 711/163 |
| 5,860,112 A * | 1/1999 | Langendorf et al. | ......... | 711/143 |
| 5,974,499 A * | 10/1999 | Norman et al. | ............... | 711/103 |
| 6,032,237 A * | 2/2000 | Inoue et al. | .................... | 711/163 |
| 6,762,701 B2 * | 7/2004 | Jiang | .............................. | 341/98 |
| 6,900,745 B2 * | 5/2005 | Jiang | .............................. | 341/98 |
| 7,043,592 B2 * | 5/2006 | Nagano | ........................ | 710/307 |
| 7,148,825 B2 * | 12/2006 | Jiang | .............................. | 341/97 |
| 7,320,045 B2 * | 1/2008 | Randell et al. | ................. | 710/307 |
| 7,873,779 B2 * | 1/2011 | Maddali et al. | ............... | 711/103 |
| 8,213,229 B2 * | 7/2012 | Wilson et al. | ............ | 365/185.11 |
| 2003/0145149 A1* | 7/2003 | Nagano | ........................ | 710/307 |
| 2004/0113822 A1* | 6/2004 | Jiang | .............................. | 341/98 |
| 2004/0128464 A1* | 7/2004 | Lee et al. | ...................... | 711/171 |
| 2004/0128465 A1* | 7/2004 | Lee et al. | ...................... | 711/171 |
| 2005/0226312 A1* | 10/2005 | Koslar et al. | .................. | 375/142 |
| 2005/0268025 A1* | 12/2005 | Smith et al. | .................... | 711/103 |
| 2006/0020764 A1* | 1/2006 | Kim et al. | ..................... | 711/168 |

(Continued)

FOREIGN PATENT DOCUMENTS

JP 02311194 A * 12/1990 ................ H02P 7/29

OTHER PUBLICATIONS

Masuoka et al.,"New Ultra High Density EPROM and Flash EEPROM With NAND Structure Cell", Electron Devices Meeting, 1987, vol. 33, pp. 552-555, http://ieeexplore.ieee.org/stamp/stamp.jsp?tp=&arnumber=1487443.*

*Primary Examiner* — Edward Dudek, Jr.
*Assistant Examiner* — Christopher Birkhimer
(74) *Attorney, Agent, or Firm* — WPAT, PC; Justin King

(57) ABSTRACT

An electronic device including a NAND flash memory, an auxiliary memory, and a controller is provided. A code for detecting a read command sequence of the NAND flash memory is stored in the auxiliary memory. During a boot procedure of the electronic device, the controller reads the code from the auxiliary memory and executes the code to obtain the read command sequence of the NAND flash memory, so as to access content stored in the NAND flash memory according to the read command sequence.

12 Claims, 7 Drawing Sheets

(56) References Cited

U.S. PATENT DOCUMENTS

| | | | |
|---|---|---|---|
| 2007/0005875 A1* | 1/2007 | Oshima ................. | 711/103 |
| 2008/0148132 A1* | 6/2008 | Mavila ................... | 714/779 |
| 2008/0183948 A1* | 7/2008 | Sugawa et al. ......... | 711/103 |
| 2008/0200206 A1* | 8/2008 | Mansson et al. ....... | 455/556.1 |
| 2008/0244179 A1* | 10/2008 | Kealy et al. ........... | 711/115 |
| 2008/0288715 A1* | 11/2008 | Maddali et al. ....... | 711/103 |
| 2008/0294837 A1* | 11/2008 | Suda ...................... | 711/103 |
| 2009/0019214 A1* | 1/2009 | Kim ....................... | 711/103 |
| 2009/0077411 A1* | 3/2009 | Tokuhiro ................ | 713/601 |
| 2011/0099325 A1* | 4/2011 | Roh et al. ............... | 711/103 |
| 2011/0138111 A1* | 6/2011 | Kim et al. .............. | 711/103 |

\* cited by examiner

ELECTRONIC DEVICE, MEMORY CONTROLLING METHOD THEREOF AND ASSOCIATED COMPUTER-READABLE STORAGE MEDIUM

FIELD OF THE INVENTION

The present invention relates to a NAND flash memory, and more particularly, to a method for automatically detecting a read command sequence of a NAND flash memory.

BACKGROUND OF THE INVENTION

A NAND flash memory, featuring advantages of high capacity, low cost, and fast access, is extensively applied in various consumer electronic products. Apart from storing user data, a NAND flash memory is also frequently used in storage of memory space-consuming software data and programs, such as an operating system. However, constrained by a characteristic of a NAND flash memory that a single pin is assigned to serve both an address transmission port and a data transmission port there of boot procedure a controller in an electronic device using a NAND flash memory for storing software and codes is incapable of directly accessing the software and program codes from the NAND flash memory in a boot procedure. More specifically, only when a read command sequence is correctly sent, can the controller obtain data from the NAND flash memory; nevertheless, it remains a dilemma that the read command sequence is yet unknown to the controller during the boot procedure.

A read command sequence is determined according to capacity and a type of a NAND flash memory. As to current NAND flash memories, the read command sequence comes in four types: the first is a command 00 followed by a 3-byte address, the second is a command 00 followed by a 4-byte address, the third is a command 00 followed by a 4-byte address and then a command 30, and the fourth is a command 00 followed by a 5-byte address and then a command 30. The commands 00 and 30 are commands in hexadecimal representation, and the addresses of different lengths represent addresses of stored data to be read by the controller.

With respect to the issue that a controller is incapable of directly accessing software and codes from a NAND flash memory during a boot procedure, several solutions associated with the prior art are described as follows.

A first solution is to adopt a NOR flash memory for boot procedure. When an electronic device is powered on or reset, a controller therein first read a first segment of software program from the NOR flash memory to activate a corresponding hardware system (e.g., to set a DRAM memory controller), and then access subsequent software data and codes from the NAND flash memory. Content of the NOR flash memory can be modified repetitively, allowing a read command sequence applicable to the NAND flash memory to be written to the above-mentioned first segment of software program, so as to enable the controller to access the NAND flash memory accurately. However, this solution suffers from two shortcomings. One shortcoming is that the NOR flash memory is higher in cost that increases costs of the electronic device. The other shortcoming is that, it is necessary for the software program in the NOR flash memory to be correspondingly updated in the event that the electronic device manufacturer chooses to use NOR flash memories of other capacities due to variables such as inventory or material preparation reasons, which also infers to additional costs from manpower to time, and even a delay in product delivery.

One other current solution is to boot with a OneNand™ flash memory. The OneNand™ flash memory integrates a NAND flash memory chip, an SRAM chip and a logic chip into one single chip, and adopts a NOR flash memory interface. When the electronic device is powered on or reset, the OneNand™ flash memory enters a code reset mode upon detecting a voltage rising edge to relocate first 1000 bits of data in the NAND flash memory to the SRAM memory, so as to allow the controller to access the relocated data via the NOR flash memory. The above 1000 bits of data, representing a first segment of software program for initializing the hardware system, assist the controller to obtain subsequent software data and codes from the NAND flash memory to continue with the boot procedure. Again, this solution also suffers from two shortcomings. One shortcoming is that, the OneNand™ flash memory is similarly higher in cost that increases costs of the electronic device. The other shortcoming is that, in the event the electronic device manufacture decides to replace the OneNand™ flash memory with other types of memories, it is necessary for corresponding circuit board systems to be redesigned and again manufactured, meaning that flexibilities for hardware adjustments are greatly restricted.

There is yet another solution that adopts an eMMC memory for the boot procedure. An eMMC memory bundles a NAND flash memory with a controller chip, and communicates with an external processor through a MultiMediaCard interface. An eMMC memory of version 4.3 and onwards is equipped with a boot mode, which allows an external processor to read software data and codes from the eMMC memory required for the boot procedure. Similarly, this solution cannot escape from shortcomings of being high in cost and low in modification flexibilities. Furthermore, differences between response time after initialization of eMMC memories of different manufacturers increase design complexities of the controller.

SUMMARY OF THE INVENTION

Therefore, the object of the present invention is to provide a novel memory controlling method that implements an automatic detection procedure for identifying a read command sequence applicable for a NAND flash memory in the electronic device. Through appropriate designs, the present invention is applicable to a NAND flash memory of any type. In cases that the electronic device manufacturer chooses NAND flash memories of different capacities based on variables such as inventory and material preparation reasons, the automatic detection procedure is nevertheless capable of identifying the corresponding read command sequence. Thus, not only time and money consumed by manual software modification can be eliminated, but also hardware modification flexibilities are reserved.

The present invention also provides an electronic device comprising a NAND flash memory, an auxiliary memory and a controller. The auxiliary memory stores a first code for detecting a read command sequence associated with the NAND flash memory. During a boot procedure of the electronic device, the controller reads the first code stored in the auxiliary memory and executes the first code to obtain the read command sequence, and accesses a stored content of the NAND flash memory according to the read command sequence.

The present invention further provides a memory controlling method applicable in a boot procedure of an electronic device. The electronic device comprises a NAND flash memory and an auxiliary memory. The method comprises steps of reading a first code stored in the auxiliary memory, executing the first code to detect a read command sequence associated with the NAND flash memory, and accessing a stored content in the NAND flash memory according to the read command sequence.

The present invention yet provides a computer-readable storage medium storing a first code readable and executable by a controller. During a boot procedure of an electronic device, the first code is utilized for detecting a read command sequence associated with a NAND flash memory. The first code comprises a first sub-code for transmitting a candidate read command sequence to the NAND flash memory, a second sub-code for detecting whether the NAND flash memory generates a response signal, and a third sub-code for repeatedly executing the second sub-code until the NAND flash memory generates the response signal. The second sub-code comprises transmitting another candidate read command sequence to the NAND flash memory when a detection result of the second sub-code is negative.

Apart from identifying the read command sequence, the automatic detection procedure according to the present invention can also be utilized to determine a data bus width of the NAND flash memory. The code of the automatic detection procedure may be stored in a low-cost, read-only memory to again lower an overall cost of the electronic device, and provides enhanced convenience and speed when realized through the code. Compared to solutions associated with the prior art, the method for controlling memory according to the present invention is provided with advantages of being low in cost and high in flexibility.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
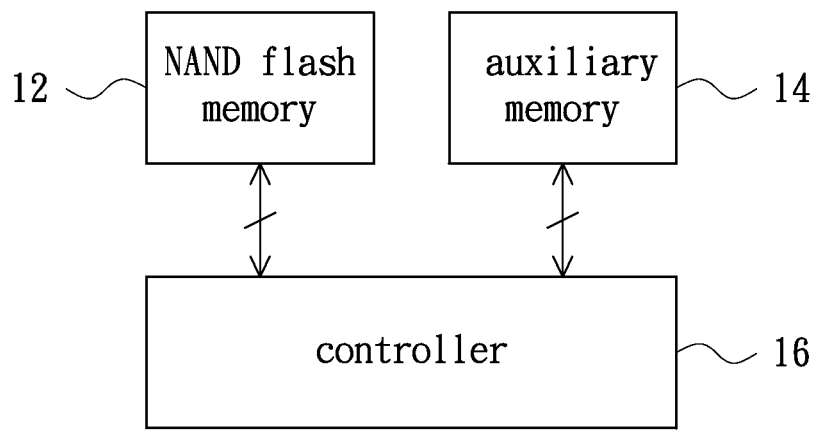
FIG. 1 is a schematic diagram of an electronic device according to an embodiment of the invention.

FIG. 1 shows a schematic diagram of an electronic device 10 according to a first embodiment of the present invention. The electronic device 10 comprises a NAND flash memory 12, an auxiliary memory 14, and a controller 16. For example, the electronic device 10 can be a digital video camera, a mobile communication device, a laptop computer, a desktop computer, or other externally connected storage device that implements the NAND flash memory 12.

The NAND flash memory 12 has only one applicable read command sequence. The auxiliary memory 14 stores a code for detecting the read command sequence. As shown in FIG. 1, the controller 12 respectively connects to the NAND flash memory 12 and the auxiliary memory 14. When the electronic device 10 is activated (e.g., power-on or reboot), the controller 16 reads the code from the auxiliary memory 14 and executes the code to obtain the read command sequence from the NAND flash memory 12. How the controller 16 obtains the read command sequence shall be described in detail below.

As mentioned previously, as to current NAND flash memories, the read command sequence comes in four types: the first is a command 00 followed by a 3-byte address, the second is a command 00 followed by a 4-byte address, the third is a command 00 followed by a 4-byte address and then a command 30, and the fourth is a command 00 followed by a 5-byte address and then a command 30. In the description below, the read command sequence applicable to the NAND flash 12 from N types of read command sequences is taken as an example, wherein N is a positive integral.

Figure 2:
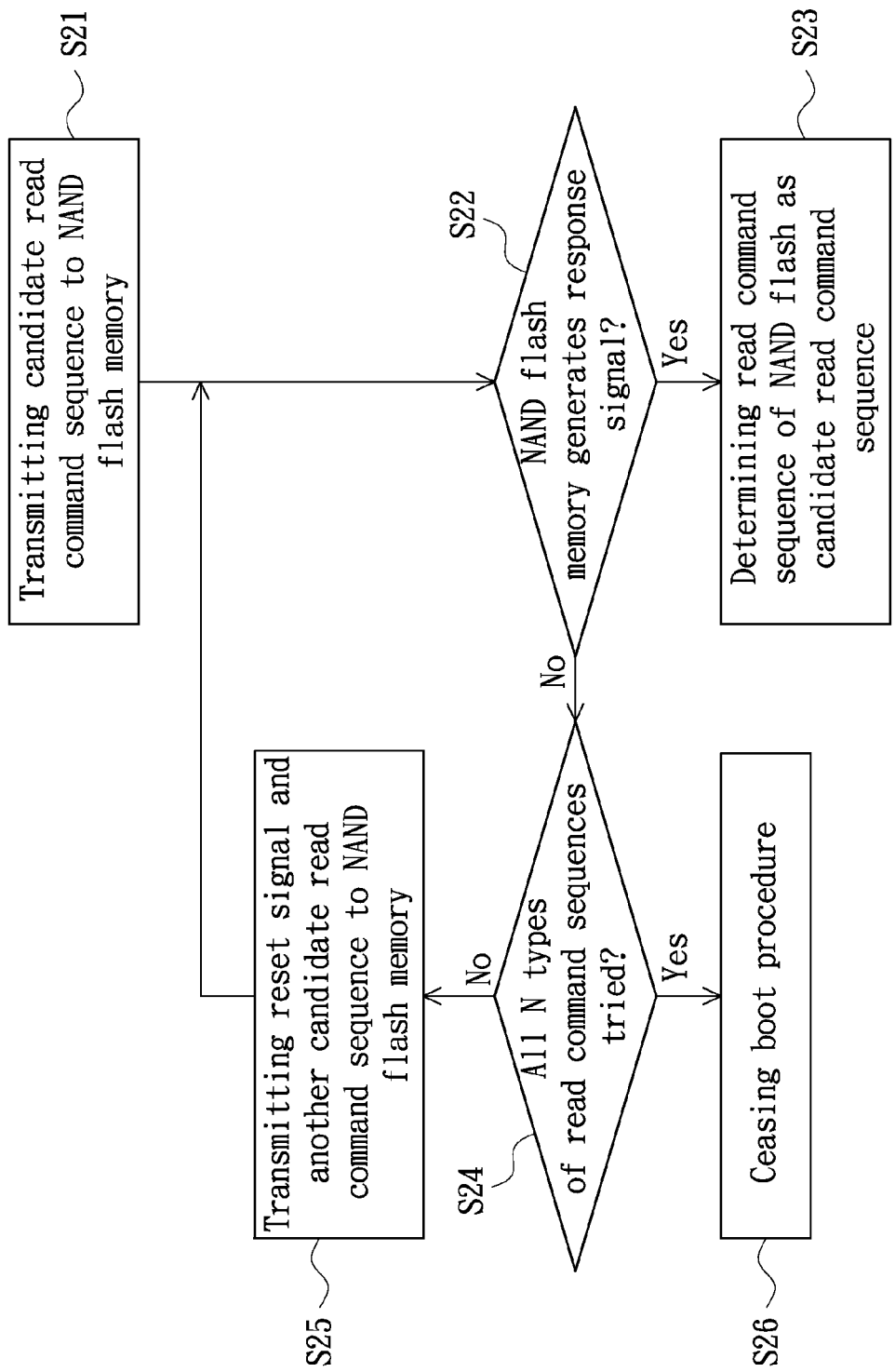
FIG. 2 is a flowchart of a read command sequence detection procedure corresponding to a code according to an embodiment of the present invention.

FIG. 2 shows a flowchart of a detection procedure corresponding to the code stored in the auxiliary memory 14 according to an embodiment of the present invention. In Step S21, the code prompts the controller 16 to transmit a reset signal and a first-type candidate read command sequence among N types of read command sequences to the NAND flash memory 12. Take a command 00 followed by a 3-byte address as the first-type candidate read command sequence as an example, wherein the 3-byte address represents, e.g., an address of a first data row of a first block in the NAND flash memory 12. The reset signal prompts the NAND flash memory 12 to re-enter an initial status boot procedure during which external commands are received.

In Step S22, the controller 16 waits and detects whether the NAND flash memory 12 generates a response signal. In practice, all types of flash memories comprise a read/busy output pin (i.e., an R/B pin), which is generally set to a high voltage level as a default to indicate that the NAND flash memory is under a not-busy status and is ready to accept a read command sequence. Conversely, when the R/B pin is at a low voltage level, it indicates that the NAND flash memory has received an applicable read command sequence from external and is loading data corresponding to the received read command sequence to a temporary storage block in the NAND flash memory, which entails that the data are ready to be read by an external circuit. After having loaded the data to the temporary storage block, the R/B pin returns to a high voltage level. In this embodiment, the controller determines whether the NAND flash memory 12 generates a response signal by detecting the voltage level at the R/B pin of the NAND flash memory 12. More specifically, a transition of the voltage level of the R/B pin from high to low and then from low to high is considered as an indication that a response signal is generated by the NAND flash memory 12.

Supposing that the read command sequence applicable for the NAND flash memory 12 is the first-type candidate read command sequence, the voltage level at the R/B pin of the NAND flash memory 12 changes from high to low and then from low to high. In contrast, supposing the read command sequence applicable for the NAND flash memory 12 is not the first-type candidate read command sequence, the voltage level at the R/B pin of the NAND flash memory 12 remains high.

Figure 3:
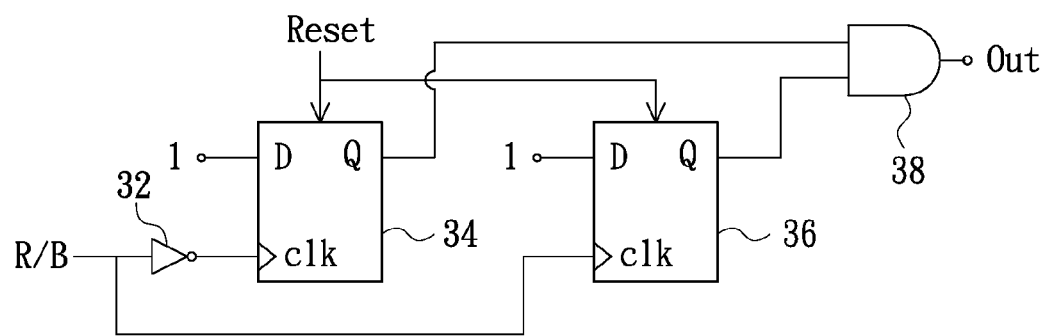
FIG. 3 is a schematic diagram of a detection circuit for detecting a response signal of a NAND flash memory according to an embodiment of the present invention.

In practice, the controller 16 may adopt a flip-flop circuit in FIG. 3 to detect the voltage change of the R/B pin. The output ends Q of the flip-flops 34 and 36 are originally set to 0 by a reset signal Reset, and are triggered by a received positive edge of a clock end CLK. The clock end CLK of the flip-flop 34 receives an R/B pin signal inverted by an inverter 32, whereas the clock end CLK of the flip-flop 36 directly receives an R/B pin signal. When the voltage level at the R/B pin changes from high to low, the output end Q of the flip-flop 34 changes from 0 to 1; when the voltage level at the R/B pin changes from low to high, the output end Q of the flip-flop 36 also changes from 0 to 1. Therefore, an output signal Out of an AND gate changes from 0 to 1 to indicate that a response signal is provided by the NAND flash memory 12.

In continuation of the above, when a determination result in Step S22 is affirmative, the controller 16 determines in Step S23 that the read command sequence applicable for the NAND flash memory 12 is the first-type candidate read command sequence. Conversely, when the determination result in Step S22 is negative, the controller 16 proceeds to perform Step S24 to determine whether all of the N types of candidate read command sequences have been sent to the NAND flash memory 12 for trials. When a determination result in Step S24 is negative, Step S25 is performed to transmit a reset signal and an untried candidate read command sequence from the N types of candidate read command sequences to the NAND flash memory 12. The controller 16 then iterates Step S22 to wait and detect whether a response signal is generated by the NAND flash memory 12. When the determination result in Step S24 is affirmative, it entails that the read command sequence applicable for the NAND flash memory 12 is not any of the N types of read command sequences, and so the controller 16 performs Step S26 to cease the boot procedure.

For example, the code can be designed in a way that the controller 16 tries one after another the first-type to the fourth-type read command sequences until a response signal from the NAND flash memory 12 is detected, or until it is confirmed that none of the read command sequences causes the NAND flash memory 12 to generate a response signal. Upon confirmation of the read command sequence applicable for the NAND flash memory 12, the controller 16 reads stored content in the NAND flash memory 12 according to the read command sequence to proceed on the boot procedure or other subsequent operations. For example, the controller 16 obtains parameters of a DRAM controller from the NAND flash memory 12. According to the parameters obtained, the controller 16 activates the DRAM controller, and then loads subsequent software program obtained from the NAND flash memory 12 to the DRAM to execute the software program. For example, the code can be designed as the controller 16 starting reading data from the NAND flash memory 12 upon the output signal Out from the AND gate 38 changes from 0 to 1, so as to increase a boot speed of the electronic device 10.

It is clearly illustrated by the above embodiment that, the controller 16 is capable of detecting with a single code and thus obtaining the read command sequence of the NAND flash memory 12 regardless the type of NAND memory flash implemented by the electronic device 10. In other words, the content of the code need not to be modified according to the type of NAND flash memory 12. Therefore, in practice, the auxiliary memory 14 for storing the code is a read-only memory that is not rewritable, e.g., a mask ROM. Compared to the NOR flash memory, OneNand™ flash memory or eMMC memory adopted by the prior art, the read-only memory is much lower in cost to thereby significantly reducing an overall hardware cost of the electronic device 10.

Furthermore, supposing all possible candidate read command sequences are included in the code, the solution above can be applicable to all types of NAND flash memories. In cases that the electronic device manufacturer chooses NAND flash memories of different capacities based on variables such as inventory and material preparation reasons, the automatic detection procedure is nevertheless capable of identifying the corresponding read command sequence. Thus, not only time and money consumed by manual software modification can be eliminated to enhance shipping efficiency, but hardware modification flexibilities are also reserved.

Figure 4:
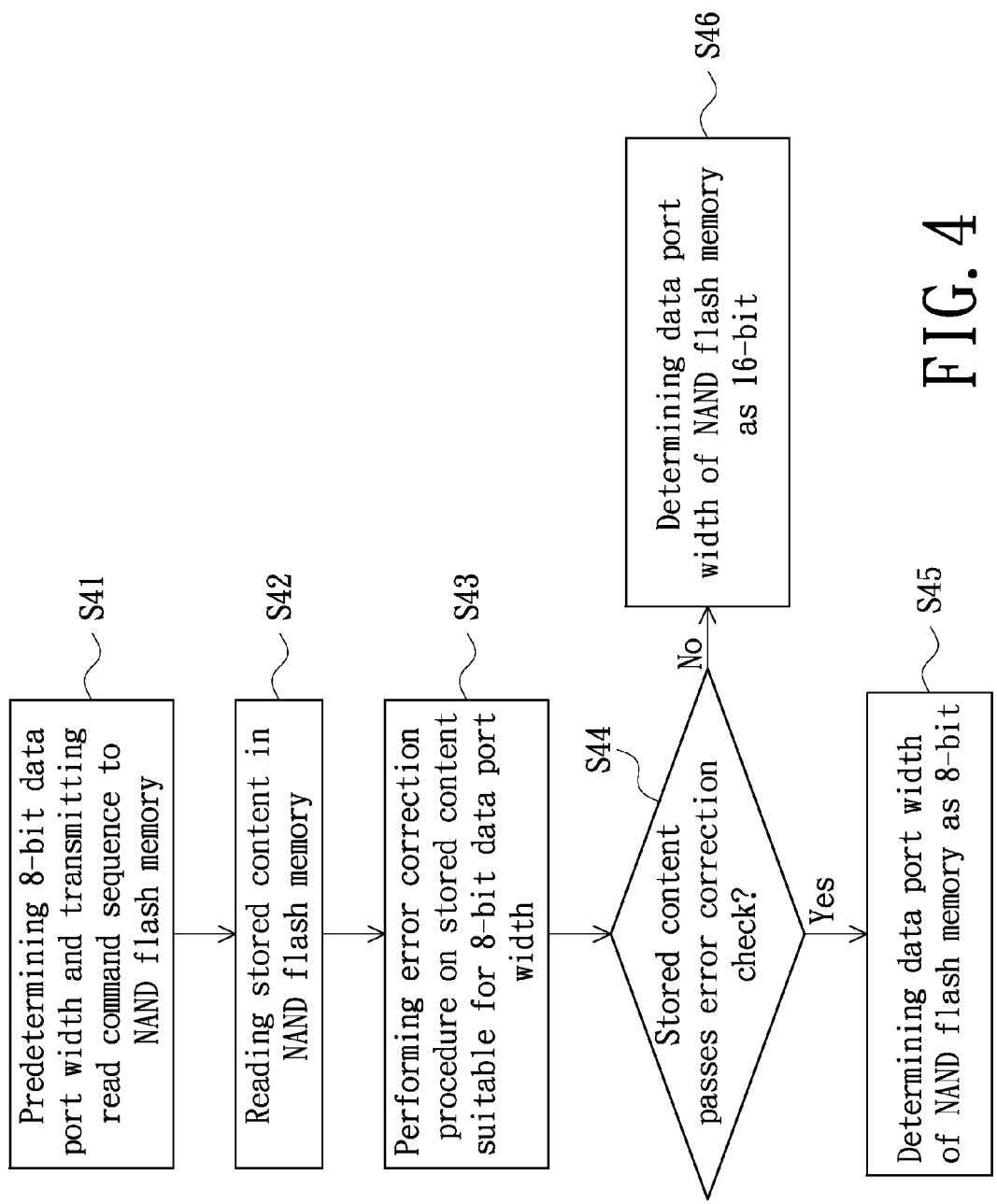
FIG. 4 is a flowchart of a detection procedure for a data bus width corresponding to a code according to an embodiment of the present invention.

On the other hand, the auxiliary memory 14 further stores a second code for assisting the controller 16 in detecting a data bus width of the NAND flash memory 12, prompting the controller 16 to perform along a process according to a flowchart in FIG. 4 after Step S23. For example, the data bus (port) width of the NAND flash memory 12 is 8-bit or 16-bit. In this example, the data bus (port) width of the NAND flash memory 12 is predetermined 8-bit, and a read command is transmitted to a NAND flash memory 12 in Step S41. In Step S42, the controller 16 reads the NAND flash 12 in response to the stored content provided by the read command. In general, data written into the NAND flash memory 12 first undergoes an error correction procedure, and a data correction code generated from such procedure is also stored. That is to say, the stored content read by the controller 16 correspondingly contains the data correction code.

In Step S43, the controller 16 performs an error correction procedure suitable for an 8-bit data bus (port) width with respect to the stored content, so as to generate another data correction code, which is then compared with the data correction code contained in the stored content. When a difference between the two is within a tolerable range, the controller 16 determines that stored content passes the error correction check. As shown in FIG. 4, when a determination result in Step S44 is affirmative, the controller 16 performs Step S45 to determine that the data bus width of the NAND flash memory 12 is the predetermined data bus (port) width, i.e., an 8-bit width. Conversely, when the determination result from Step S44 is negative, the controller 16 performs Step S46 to determine the data bus (port) width of the NAND flash memory 12 is another data bus (port) width, i.e., a 16-bit width. It is to be noted that, apart from 8-bit and 16-bit widths, the above code is adjustable to accommodate other data bus (port) widths of the NAND flash memory 12, and is not limited herein.

Figure 5:
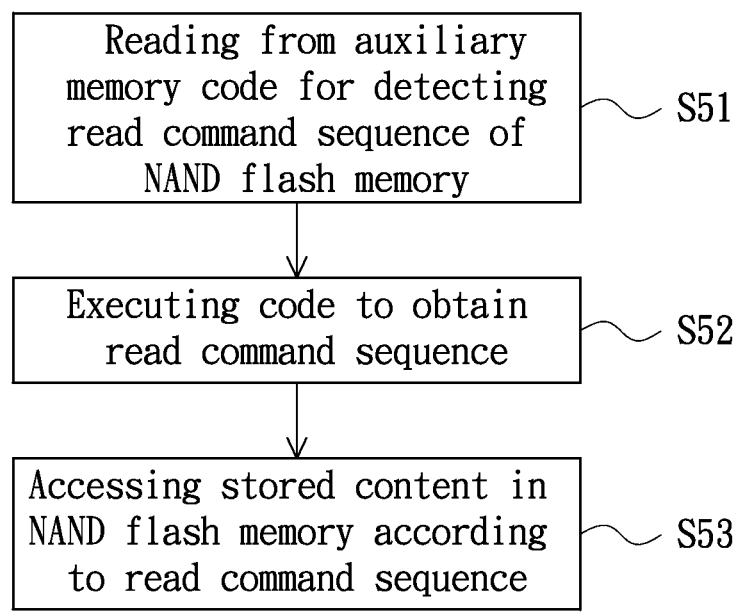
FIG. 5 is a flowchart of a method for controlling a memory according to an embodiment of the present invention.

According to another embodiment of the present invention, a method for controlling a memory of an electronic device 10 in a boot procedure (e.g., power-on or reset) is provided. The electronic device 10 comprises a NAND flash memory 12 and an auxiliary memory 14. In practice, the auxiliary memory 14 can be a read-only memory. FIG. 5 shows a flowchart of the above method. In Step S51, a code for detecting a read command sequence of the NAND flash memory 12 is read from the auxiliary memory 14. In Step S52, the code is executed to obtain the read command sequence. In Step S53, stored content in the NAND flash memory 12 is accessed according to the read command sequence. FIG. 2 illustrates a flowchart of a detection procedure corresponding to the above code.

Figure 6:
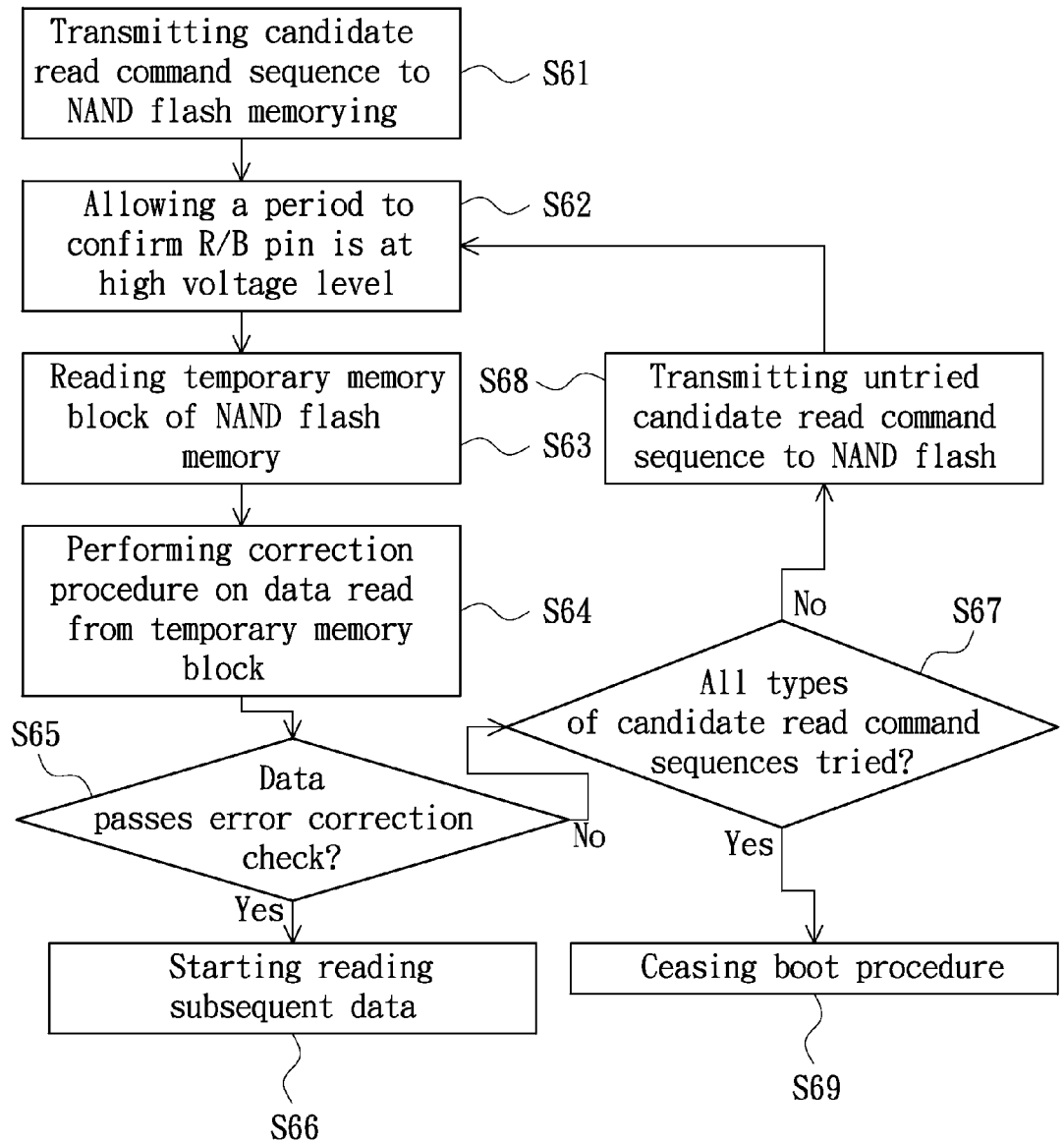
FIG. 6 and FIG. 7 are flowcharts of read command sequence detection procedures corresponding to codes according to embodiments of the present invention.

FIG. 6 shows a flowchart of another detection procedure corresponding to the above code. A concept of this detection procedure is also that all possible combinations of read command sequences are transmitted to the NAND flash memory 12 for trials. A main difference between this example and the two previous examples is that the procedure of this example determines whether the currently tried read command sequence is correct according to whether the data in the temporary memory block in the NAND flash memory 12 passes the error correction check. For example, the possible combinations of read command sequences may include the combinations with conditions below: whether an end of the read command sequence comprises a command 30, the number of bytes included in the address of the read command sequence, and to which data row in the NAND flash memory 12 the address corresponds.

As shown in FIG. 6, in Step S61, a first candidate read command sequence is transmitted to the NAND flash memory 12. In this embodiment, the first candidate read command sequence comprises a 3-byte address, with its end comprises no command 30, and the address corresponds to a first data row of a first block in the NAND flash memory 12. Supposing the read command sequence applicable for the NAND flash memory 12 is the currently tried candidate read command sequence, the voltage level at the R/B pin of the NAND flash memory 12 changes from high to low, and then returns to high after having loaded the data in the first data row of the first data block to the temporary memory block, so as to indicate that the data is ready. In Step S62, a period of time is allowed to confirm that the voltage level at the R/B pin of the NAND flash memory 12 is high. In Step S63, the temporary memory block in the NAND flash memory 12 is read. In Step S64, an error correction procedure is performed on the read data from the temporary memory block.

Figure 7:
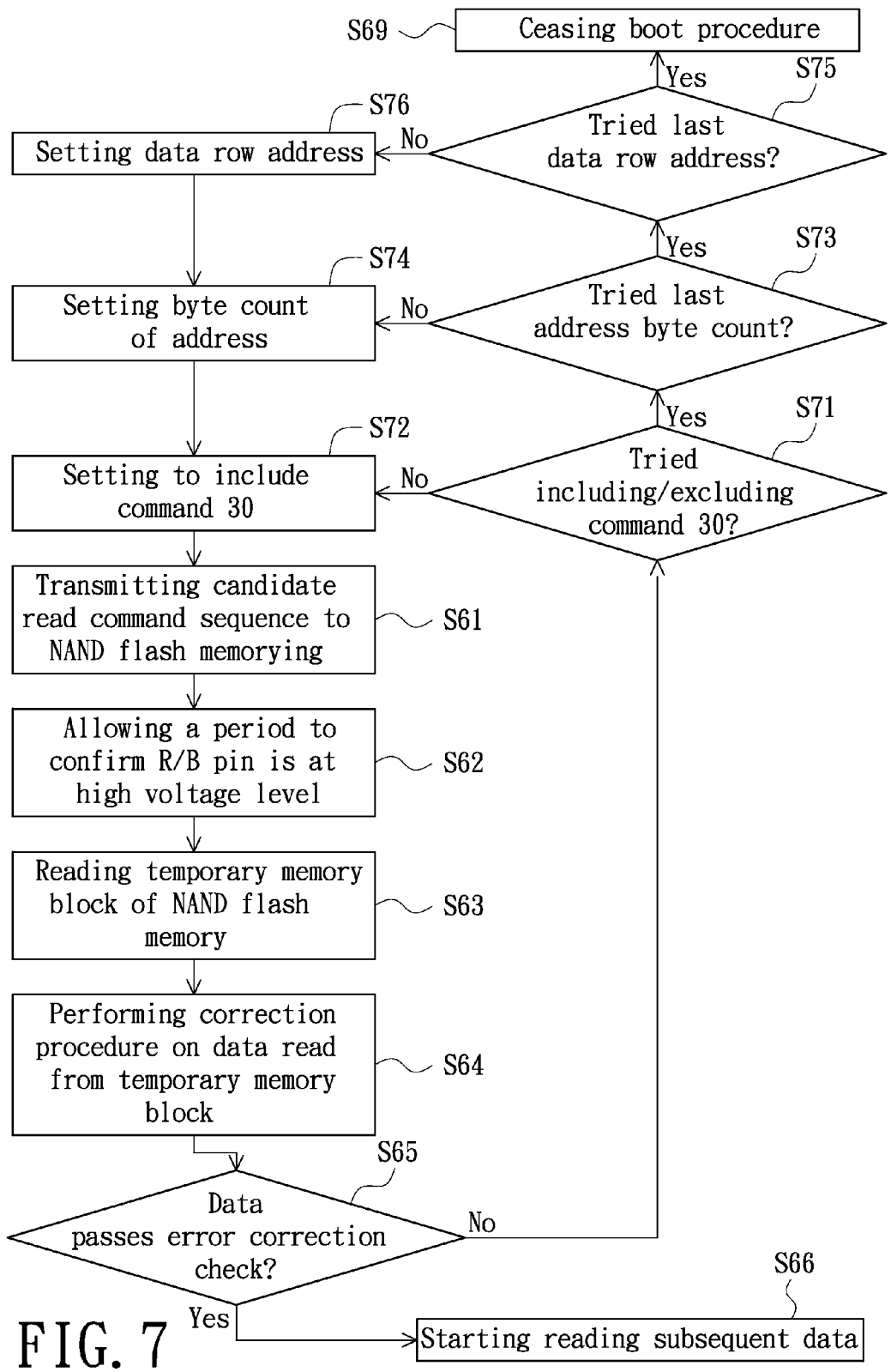

In Step S65, it is determined whether the read data from the temporary memory block passes an error correction check according to a result in Step S64. When a determination result in Step S65 is affirmative, it means that the read command sequence applicable for the NAND flash memory 12 is the currently tried candidate read command sequence. Thus, Step S66 is performed to start reading subsequent data from the NAND flash memory 12 according to the currently tried read command sequence. Conversely, when the read command sequence suitable for the NAND flash memory 12 is not the currently tried read command sequence, the NAND flash memory 12 does not load data of the first data row in the first block to the temporary memory block. Therefore, the read data from the temporary memory block (it is possible that a read result shows all bits are 0) fails the error correction check. As shown in FIG. 7, when the determination result from Step S65 is negative, Step S67 is performed to determine whether all candidate read command sequences have been tried.

When a determination result from Step S67 is negative, Step S68 follows to transmit a reset signal and a not yet tried candidate read command sequence to the NAND flash memory 12. When the determination result from Step S67 is affirmative, it means that all candidate read command sequences have been tried, and so Step S69 is performed to cease the boot procedure of the electronic device 10. In practice, an affirmative determination result from Step S67 may occur when abnormalities exist in the NAND flash memory 12.

FIG. 7 show a detailed flowchart of trials of candidate read command sequences according to an embodiment of the present invention. In this embodiment, Steps S67 and S68 in FIG. 6 are realized by Steps S71 to S76. Steps S72, S74 and S76, which are executed before Step S61, are respectively for setting whether the candidate read command sequence comprises a command 30, a byte count of address, and a data row corresponding to the address. For example, through Steps S72, S74 and S76, the first candidate read command sequence is set as "having an address byte count of 3, with an end including a command 30, and an address corresponding to the first data row of the first block". When the determination result from Step S65 is negative, Step S71 is performed to determine whether two combinations of "having an address byte count of 3, with an end including/excluding a command 30, and an address corresponding to the first data row of the first block" have been tried. When a determination result from Step S71 is negative, Step S72 is performed to modify a next candidate read command sequence to be transmitted as "having an address byte count of 3, with an end including a command 30, and an address corresponding to the first data row of the first block".

When the determination result from Step S71 is affirmative, it means that two combinations of "having an address byte count of 3, with an end including/excluding a command 30, and an address corresponding to the first data row of the first block" have been tried, Step S73 follows to determine whether a last address byte count has been previously tried, e.g., whether address byte counts 3, 4 and 5 have all been tried. When a determination result from Step 73 is negative, Step S74 is performed to set the address byte count of a next candidate read command sequence as not yet tried. Conversely, when the determination result from Step S73 is affirmative, it means that all six combinations of "having an address byte count of 3/4/5, with an ending including/excluding 30" have been tried. Next, Step S75 is performed to determine whether a last data row address has been previously tried, e.g., whether the first data row of a last block of the NAND flash memory 12 has been tried. When a determination result in Step S75 is negative, Step S76 is performed to modify the data row address of a next candidate read command sequence to be transmitted to correspond to a first data row of a next block. When the determination result from Step S75 is affirmative, Step S69 is performed to cease the boot procedure of the electronic device 10.

In practice, after executing the process in FIG. 5, the detection procedure on the data bus width of the NAND flash memory 12 shown in FIG. 4 may be performed subsequently. More specifically, in an embodiment of the present invention, the code stored in the auxiliary memory 14 may handle the detection of data bus width of the read command sequence of the NAND flash memory 12. As stated above, the auxiliary memory 14 for storing the code may be a read-only memory to lower hardware cost of the electronic device 10. It is to be noted that, the flowcharts illustrated by FIGS. 5 to 7 are applicable to the electronic device 10 shown in FIG. 1; that is, the processes are performed by the controller 16 in FIG. 1.

According to yet another embodiment of the present invention, a computer-readable storage medium is provided. The computer-readable storage medium stores a first code, which can be read and executed by a controller, for detecting a read command sequence of a NAND flash memory 12. For example, the computer-readable storage medium can be the auxiliary memory 14 shown in FIG. 1, or an optical storage medium, a soft disk or a hard disk, but is not limited herein. The first code comprises a first sub-code for transmitting a candidate read command sequence to the NAND flash memory 12, a second sub-code for detecting whether the NAND flash memory 12 generates a response signal, and a third sub-code for repeatedly executing the second sub-code until the NAND flash memory 12 generates the response signal. The second sub-code also comprises transmitting another candidate read command sequence to the NAND flash memory 12 when a detection result of the second sub-code is negative.

In practice, the computer-readable storage medium may further store a second code for detecting the data bus width of the NAND flash memory 12. The second code comprises a fourth sub-code for transmitting a read command to the NAND flash memory 12, a fifth sub-code for reading the stored content of the NAND flash memory 12, and a sixth sub-code for determining whether the stored content passes an error correction check. The sixth sub-code also comprises determining the data bus width of the NAND flash memory 12 as a predetermined data bus width when the stored content passes the error correction check.

With the description of the above embodiments, it is clearly illustrated that a novel memory control method is provided to render a controller to perform an automatic detection procedure for identifying a type of a read command sequence that the NAND flash memory 12 in the electronic device adopts. Through appropriate designs, the present invention is also applicable to a NAND flash memory of any type. In cases that the electronic device manufacturer chooses NAND flash memories of different capacities based on variables such as inventory and material preparation reasons, the automatic detection procedure is nevertheless capable of identifying the corresponding read command sequence. Thus, not only time and money consumed by manual software modification can be eliminated to enhance shipping efficiency, but hardware modification flexibilities are also reserved. Further, the code of the automatic detection procedure may be stored in a low-cost, read-only memory to again lower an overall cost of the electronic device 10, and provides enhanced convenience and speed when realized through the code. Compared to solutions associated with the prior art, the method for controlling memory according to the present invention offers advantages of being low in cost and high in flexibility.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device, comprising:
a NAND flash memory;
an auxiliary memory, for storing a first code for detecting a correct read command sequence associated with the NAND flash memory, and for storing a second code from the auxiliary memory for detecting a data bus width of the NAND flash memory, wherein said first code comprises a plurality of candidate read command sequences; and
a controller, respectively connected to the NAND flash memory and the auxiliary memory, for reading said first code and said second code from the auxiliary memory, executing the first code during a boot procedure of the electronic device to detect the correct read command sequence among said plurality of candidate read command sequences for accessing the NAND flash memory, and executing the second code to obtain the data bus width; wherein the second code corresponds to a third detection procedure comprising steps of:
transmitting a read command to the NAND flash memory;
reading the stored content from the NAND flash memory; and
determining whether the stored content passes an error correction check, and determining the data bus width of the NAND flash memory as a predetermined data bus width when the stored content passes the error correction check.

2. The electronic device according to claim 1, wherein the auxiliary memory is a read-only memory.

3. The electronic device according to claim 1, wherein the auxiliary memory further stores a second code for detecting a data bus width of the NAND flash memory.

4. A memory controlling method applicable in a boot procedure of an electronic device, the electronic device comprising a NAND flash memory and an auxiliary memory, the method comprising:
reading a first code stored in the auxiliary memory, wherein said first code comprises a plurality of candidate read command sequences;
executing the first code to detect a correct read command sequence among said plurality of candidate read command sequences for assessing the NAND flash memory;
accessing a stored content in the NAND flash memory according to the correct read command sequence;
reading a second code from the auxiliary memory for detecting a data bus width of the NAND flash memory; and
executing the second code to obtain the data bus width; wherein the second code corresponds to a third detection procedure comprising steps of:
transmitting a read command to the NAND flash memory;
reading the stored content from the NAND flash memory; and
determining whether the stored content passes an error correction check, and determining the data bus width of the NAND flash memory as a predetermined data bus width when the stored content passes the error correction check.

5. The method according to claim 4, wherein the auxiliary memory is a read-only memory.

6. The method according to claim 4, wherein the first code corresponds to a first detection procedure comprising steps of:
(a1) transmitting a first candidate read command sequence of said plurality of candidate read command sequences to the NAND flash memory;
(a2) detecting whether the NAND flash memory generates a response signal to a most recently received candidate read command sequence; and
(a3) transmitting another candidate read command sequence of said plurality of candidate read command sequences to the NAND flash memory when no response signal is detected, and repeating Step (a2) and Step (a3) until the NAND flash memory generates the response signal or completing transmitting every available candidate read command sequence to the NAND flash memory.

7. The method according to claim 6, wherein the NAND flash memory generates the response signal when a voltage level of a ready/busy (R/B) output pin changes from high to low and then from low to high.

8. The method according to claim 4, wherein the first code corresponds to a second detection procedure comprising steps of:
(b1) transmitting one of said plurality of candidate read command sequences to the NAND flash memory;
(b2) reading data in a temporary memory block of the NAND flash memory if the NAND flash memory responds to the transmitted candidate read command sequence, and determining whether the data passes an error correction check;

(b3) when a result from step (b2) is negative, determining whether all of the plurality of candidate read command sequences have been chosen in Step (b1); and (b4) when a result from step (b3) is negative, transmitting another candidate read command sequence to the NAND flash memory, and repeating steps (b2) and (b3).

9. A non-transitory computer-readable storage medium, storing a first code readable and executable by a controller, the first code detecting a read command sequence associated with a NAND flash memory during a boot procedure of an electronic device, wherein the first code comprising:

a first sub-code, for transmitting a candidate read command sequence of a plurality of candidate read command sequences to the NAND flash memory;

a second sub-code, for detecting whether the NAND flash memory generates a response signal in responding to a most recently received transmitted candidate read command sequence, and transmitting next candidate read command signal when no response signal is detected;

a third sub-code, for repeatedly executing the second sub-code until the NAND flash memory generates the response signal or completing transmitting every available candidate read command signal to the NAND flash memory;

a fourth sub-code, for transmitting a read command to the NAND flash memory;

a fifth sub-code, for reading a stored content from the NAND flash memory; and a sixth sub-code, for determining whether the stored content passes an error correction check, and determining the data bus width of the NAND flash memory as a predetermined data bus width when the stored content passes the error correction check.

10. The non-transitory computer-readable storage medium according to claim 9, wherein the NAND flash memory comprises an R/B output pin, and the response signal is generated when a voltage level of the R/B output pin changes from high to low and then from low to high.

11. The non-transitory computer-readable storage medium according to claim 10, wherein the controller comprises a flip-flop circuit connected to the R/B output pin, and the flip-flop circuit comprises an output end that provides the response signal according to the voltage level of the R/B output pin.

12. The non-transitory computer-readable storage medium according to claim 9, wherein said second sub-code further transmits a reset signal along with transmitting the next candidate read command sequence.

* * * * *